US012764893B2

(12) United States Patent
Nolan et al.

(10) Patent No.: US 12,764,893 B2
(45) Date of Patent: Oct. 13, 2026

(54) SERVER RACK WITH AUTO-POSITIONING SHELF

(71) Applicant: Dell Products L.P., Round Rock, TX (US)

(72) Inventors: Philip Nolan, Glanmire (IE); Eoin M. Buckley, Ballincollig (IE); Darwin Machado, Limerick (IE)

(73) Assignee: Dell Products L.P., Round Rock, TX (US)

( * ) Notice: Subject to any disclaimer, the term of this patent is extended or adjusted under 35 U.S.C. 154(b) by 93 days.

(21) Appl. No.: 18/804,375

(22) Filed: Aug. 14, 2024

(65) Prior Publication Data

US 2026/0052641 A1 Feb. 19, 2026

(51) Int. Cl.
*H05K 7/14* (2006.01)
*H05K 7/18* (2006.01)

(52) U.S. Cl.
CPC ........... *H05K 7/183* (2013.01); *H05K 7/1489* (2013.01)

(58) Field of Classification Search
CPC ........................... H05K 7/1488; H05K 7/1489
USPC .................................................. 361/724–728
See application file for complete search history.

(56) References Cited

U.S. PATENT DOCUMENTS 1,745,164 A * 1/1930 Griffith ..................... A47F 7/28 108/23
3,788,215 A * 1/1974 Lambert ............. B41F 15/0818 101/114
3,838,266 A * 9/1974 Jonathan ................. A47F 11/10 362/127
4,061,092 A * 12/1977 Jacobsen .............. A47B 43/006 52/39
4,101,233 A * 7/1978 McConnell .......... A47B 96/024 211/187
4,558,838 A * 12/1985 Klein ........................ F16B 9/05 248/300
4,685,574 A * 8/1987 Young .................... A47B 45/00 211/184
4,742,925 A * 5/1988 Henderson ........... A47B 96/021 211/187
5,045,960 A * 9/1991 Eding .................... G11B 33/02 360/99.15
5,351,838 A * 10/1994 Flum ....................... A47F 5/005 211/153
5,402,310 A * 3/1995 Penniman ............. G06F 1/1632 361/679.44
5,645,182 A * 7/1997 Miller, Jr. ................. A47F 5/12 211/175
5,680,296 A * 10/1997 Hileman .............. H05K 7/1405 361/801
D390,268 S * 2/1998 Stravitz .......................... D19/86
5,826,730 A * 10/1998 Stravitz ...................... B42F 7/10 108/92
D436,266 S * 1/2001 Buchanan ................... D6/675.3
6,307,754 B1 * 10/2001 Le ........................ H05K 7/1454 361/796

(Continued)

*Primary Examiner* — Adrian S Wilson
(74) *Attorney, Agent, or Firm* — Jackson Walker L.L.P.

(57) ABSTRACT

An information handling system server rack may include a frame and a plurality of shelves, each shelf comprising a ledge extending a distance from the frame substantially parallel to a surface upon which the information handling system server rack sits, a sidewall extending upward from and perpendicular to the ledge, and a sloped guide extending from the frame and sloping downward to the sidewall.

6 Claims, 2 Drawing Sheets

(56) References Cited

U.S. PATENT DOCUMENTS

D450,485 S * 11/2001 Buchanan .................. D6/678.2
6,493,235 B1 * 12/2002 Barringer ............. H05K 7/1418 361/747
6,522,553 B2 * 2/2003 Hardin ................. G11B 33/124 361/801
6,557,709 B2 * 5/2003 Broome ................. H05K 7/186 211/183
6,639,808 B1 * 10/2003 Umberger ............ H05K 7/1418 361/802
6,736,276 B2 * 5/2004 Broome ................. H04Q 1/035 211/183
7,079,381 B2 * 7/2006 Brehm ................. H05K 7/1454 398/79
D537,274 S * 2/2007 Pirro .............................. D6/680
7,355,861 B2 * 4/2008 Dumney .............. H05K 7/1418 361/741
7,656,657 B2 * 2/2010 Grady ..................... G06F 1/188 361/679.37
7,659,621 B2 * 2/2010 Rinne ..................... H01L 21/44 257/737
8,099,813 B2 * 1/2012 Parker ...................... B65G 1/04 14/69.5
8,505,750 B2 * 8/2013 Shinozaki .......... A47B 47/0083 211/208
12,133,351 B2 * 10/2024 Hogan ................. H05K 7/1489
2004/0178156 A1 * 9/2004 Knorring, Jr. ............ A47F 1/12 211/151
2006/0213851 A1 * 9/2006 Grueneberg .............. A47F 5/11 211/94.01
2006/0283819 A1 * 12/2006 Larsen .................... A47F 5/005 108/59
2007/0279886 A1 * 12/2007 Grady ..................... G06F 1/188 361/809
2012/0061289 A1 * 3/2012 Langtry ................... B65D 1/10 206/459.5
2016/0374222 A1 * 12/2016 Trout ................... H05K 7/1418
2024/0260223 A1 * 8/2024 Crisp ................... H05K 7/1489
2024/0349439 A1 * 10/2024 Kidd .................... H05K 7/1492
2025/0358950 A1 * 11/2025 Wingfield ............ H05K 7/1489

* cited by examiner

SERVER RACK WITH AUTO-POSITIONING SHELF

TECHNICAL FIELD

The present disclosure relates to modular information handling systems. More specifically, embodiments of the disclosure provide systems and methods for a two-piece center wall for an information handling system chassis carrier.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Further, in some instances, a number of chassis may each be placed in a server rack configured to the hold the multiple chassis.

Due to the heavy weight of modern information handling system server chassis, robotic equipment is often used to place each chassis on its respective shelf in a server chassis. However, even the most accurate of robotic equipment may misalign a chassis on a server rack shelf when placing the chassis in the server rack. Accordingly, systems and methods for more accurately aligning server chassis upon server rack shelves may be desired.

SUMMARY

In accordance with the teachings of the present disclosure, the disadvantages and problems associated with traditional approaches to placing a server chassis in a server rack may be substantially reduced or eliminated.

In accordance with embodiments of the present disclosure, an information handling system server rack may include a frame and a plurality of shelves, each shelf comprising a ledge extending a distance from the frame substantially parallel to a surface upon which the information handling system server rack sits, a sidewall extending upward from and perpendicular to the ledge, and a sloped guide extending from the frame and sloping downward to the sidewall.

In accordance with these and other embodiments of the present disclosure, a shelf may include a ledge, a sidewall extending from and perpendicular to the ledge, and a sloped guide extending from and sloping at an angle from the sidewall.

In accordance with these and other embodiments of the present disclosure, a method may include coupling a plurality of shelves to a frame of an information handling system server rack, each shelf comprising a ledge extending a distance from the frame substantially parallel to a surface upon which the information handling system server rack sits, a sidewall extending upward from and perpendicular to the ledge, and a sloped guide extending from the frame and sloping downward to the sidewall.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
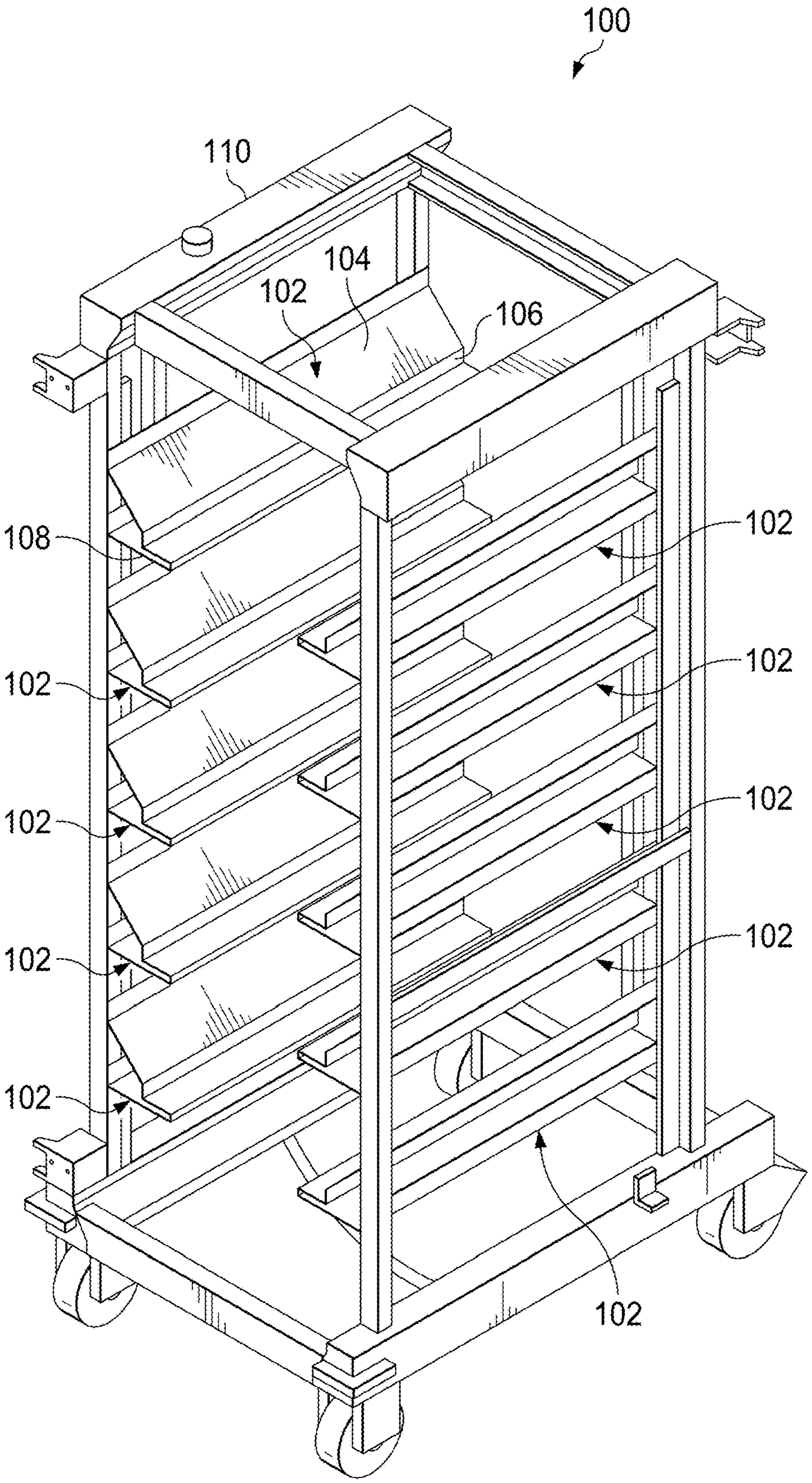
FIG. 1 illustrates an isometric perspective of an example server rack for receiving modular information handling systems, in accordance with embodiments of the present disclosure.
Figure 2:
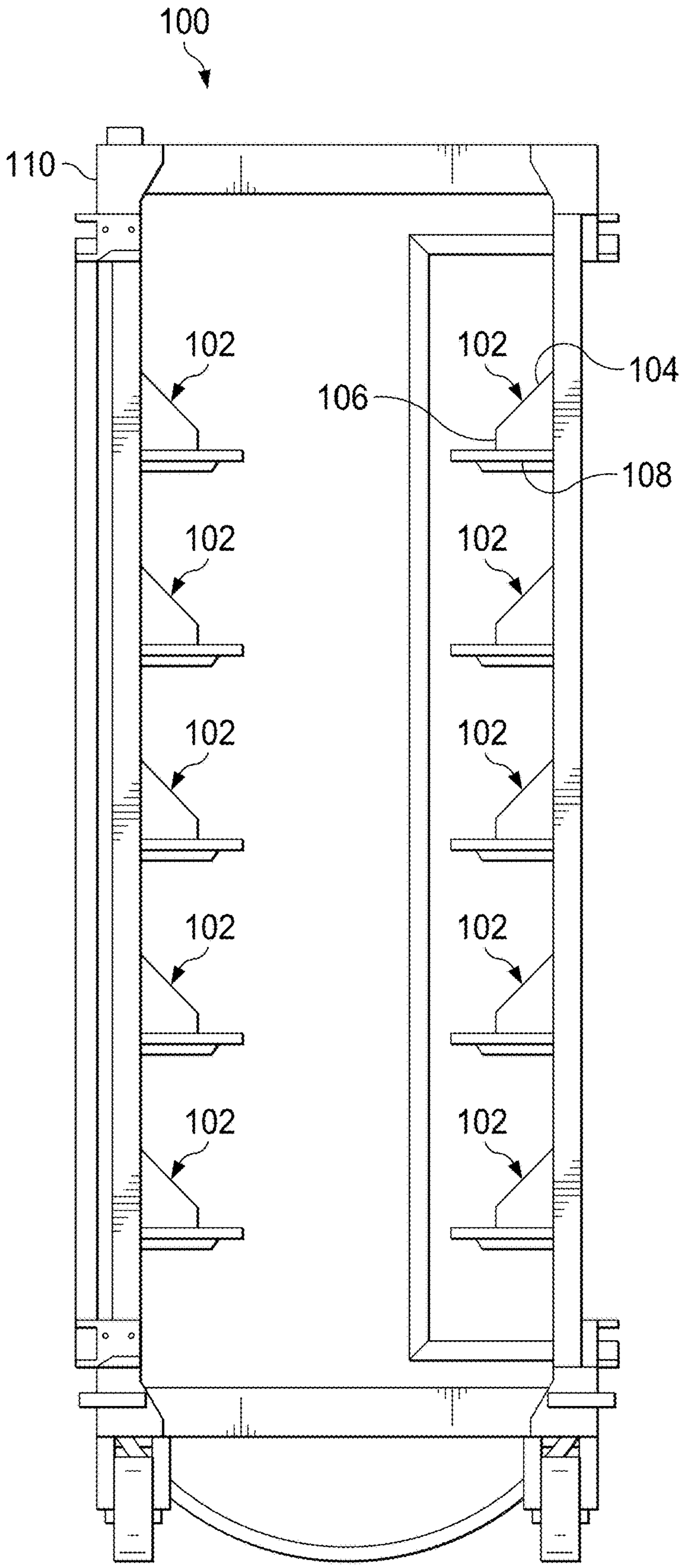
FIG. 2 illustrates a front elevation view of the example server rack shown in FIG. 1, in accordance with embodiments of the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display.

The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

FIG. 1 illustrates an isometric perspective of an example server rack 100 for receiving modular information handling systems, in accordance with embodiments of the present disclosure. FIG. 2 illustrates a front elevation view of server rack 100, in accordance with embodiments of the present disclosure. Server rack 100 may be a housing that serves as a container for various information handling systems and information handling resources, and may be constructed from steel, aluminum, plastic, and/or any other suitable material. Although the term "rack" is used, server rack 100 may also be referred to as a case, cabinet, tower, box, enclosure, and/or housing. In certain embodiments, server rack 100 may be configured to hold and/or provide power to a plurality of information handling systems and/or information handling resources. As depicted in FIG. 1, server rack 100 may include a plurality of shelves 102, each respective pair of shelves configured to receive and hold a modular information handling system or "server."

As shown in FIGS. 1 and 2, each shelf 102 may include a ledge 108 extending a distance from a frame 110 of server rack 100 and substantially parallel to the surface upon which server rack 100 sits. Further, each shelf 102 may include a sidewall 106 extending upward from and perpendicular to its ledge 108. In addition, each shelf 102 may include a sloped guide 104 extending from frame 110 and sloping downward to sidewall 106. The angle of sloped guide 104 relative to ledge 108 may be any suitable angle. In some embodiments, such angle may be 45°.

In operation, to place a modular information handling system into server rack 100, a person or robot may insert the modular information handling system within frame 110 and lower the modular information handling system upon a pair of shelves 102. Should the placement of the modular information handling system be misaligned, the modular information handling system may mechanically engage with a sloped guide 104 of one of the shelves 102, causing the modular information handling system to self-align between sidewalls 106 prior to coming to rest upon the portions of ledges 108 extending beyond sidewalls 106.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S. C. § 112(f) unless the words "means for" or "step for" are explicitly used in the particular claim.

What is claimed is:

1. An information handling system server rack comprising:

a frame; and a plurality of shelves, each shelf comprising:

a ledge extending a distance from the frame substantially parallel to a surface upon which an information handling system sits, wherein the ledge comprises a first edge and a second edge;

a sidewall extending upward from and perpendicular to the ledge, wherein the sidewall is positioned between the first edge and the second edge; and a sloped guide extending from the frame and sloping downward to the sidewall, wherein a lower edge of the sloped guide and an upper edge of the sidewall are contiguous.

2. The information handling system server rack of claim 1, wherein an angle of the sloped guide relative to the ledge is 45°.

3. A shelf comprising:

a ledge comprising a first edge and a second edge;

a sidewall extending from and perpendicular to the ledge, wherein the sidewall is positioned between the first edge and the second edge; and a sloped guide extending from and sloping at an angle from the sidewall, wherein a lower edge of the sloped guide and an upper edge of the sidewall are contiguous.

4. The shelf of claim 3, wherein the angle of the sloped guide relative to the ledge is 45°.

5. A method comprising:

coupling a plurality of shelves to a frame of an information handling system server rack, each shelf comprising:

a ledge extending a distance from the frame substantially parallel to a surface upon which an information handling rack sits, wherein the ledge comprises a first edge and a second edge;

a sidewall extending upward from and perpendicular to the ledge, wherein the sidewall is positioned between the first edge and the second edge; and a sloped guide extending from the frame and sloping downward to the sidewall, wherein a lower edge of the sloped guide and an upper edge of the sidewall are contiguous.

6. The method of claim 5, wherein an angle of the sloped guide relative to the ledge is 45°.

* * * * *